United States Patent [19]
Spraul et al.

[11] Patent Number: 5,397,989
[45] Date of Patent: Mar. 14, 1995

[54] DIRECTLY COUPLED SAMPLE CHANGER SYSTEM FOR FLUID NMR SPECTROSCOPY

[75] Inventors: Manfred Spraul, Ettlingen; Martin Hofmann, Rheinstetten, both of Germany

[73] Assignee: Bruker Analytische Messtechnik GmbH, Rheinstetten, Germany

[21] Appl. No.: 136,445

[22] Filed: Oct. 14, 1993

[30] Foreign Application Priority Data

Oct. 14, 1992 [DE] Germany .................. 42 34 544.8

[51] Int. Cl.⁶ .............................................. G01V 3/00
[52] U.S. Cl. .................................. 324/321; 324/318
[58] Field of Search ............... 324/300, 306, 307, 309, 324/321, 322, 318

[56] References Cited

U.S. PATENT DOCUMENTS

| | | | |
|---|---|---|---|
| 3,525,928 | 8/1970 | Nagao et al. | 324/321 |
| 4,638,251 | 1/1987 | King | 324/306 |
| 4,775,836 | 10/1988 | Starewicz et al. | 324/318 |
| 5,221,903 | 6/1993 | Kasten et al. | 324/321 |

FOREIGN PATENT DOCUMENTS

| | | | |
|---|---|---|---|
| 2759457 | 4/1980 | Germany . | |
| 4104075 | 3/1992 | Germany . | |
| 4101473 | 7/1992 | Germany . | |
| 2012426 | 7/1979 | United Kingdom | 324/321 |

OTHER PUBLICATIONS

GB-Book: M. L. Martin et al.: "Practical NMR Spectroscopy" Heyden & Son Ltd., London, 1980.
Catalog 5/92-7 from Wilmad Class Company in Buena, N.J. 08310 USA, pp. 28 and 29.
NMR-Spektroskopie, H. Gunther, 1983, pp. 52-54, chapter 3.1.
Direct Coupling of a Liquid Chromatograph to a Continuous Flow Hydrogen Nuclear Magnetic Resonance Detector for Analysis of Petroleum and Synthetic Fuels, 266B Analytical Chemistry, James F. Haw et al., 1980 pp. 1135-1140.

*Primary Examiner*—Louis Arana
*Attorney, Agent, or Firm*—Cesari and McKenna

[57] ABSTRACT

An NMR spectrometer (10) for the measurement of liquid samples having a probe head (20) exhibiting an upper and a lower support (21 or 22), a connector (5) for a feed conduit (15) for the introduction of a liquid sample (1) into the spectrometer (10) and a connector (6) for a drain conduit (16) for the drainage of the liquid sample (1) out of the spectrometer (10), a sample tube (3), arranged between the upper and the lower supports (21 or 22), for the acceptance of the fluid sample (1), whereby the one end of the sample tube (3) is connected to the connector (5) for the feed conduit (15) and the other end to the connector (6) for the drain conduit (16), exhibits, coaxially to the sample tube (3) a further tube (4) for the acceptance of a calibration fluid (2) which, on one end, is connected to an additional connector (7) for a feed conduit (17) to introduce the calibration fluid (2) into the spectrometer (10) and, on its other end, to an additional connector (8) for a drain conduit (18) to drain the calibration fluid (2) out of the spectrometer (10). In this manner, it is possible to measure the sample fluid (1) in a simple fashion, without the previous mixing of additives and, subsequent to the measurement, to regain the sample fluid in its original state, while allowing for the introduction of a calibration fluid (2) for field stabilization and for the quantitative comparison of line intensities.

23 Claims, 6 Drawing Sheets

DIRECTLY COUPLED SAMPLE CHANGER SYSTEM FOR FLUID NMR SPECTROSCOPY

BACKGROUND OF THE INVENTION

The invention concerns a nuclear magnetic resonance (NMR) spectrometer for the measurement of fluid, in particular biological, and most importantly water containing samples with a magnet system for the production of a homogeneous static magnetic field $B_0$ and with a probe head which exhibits an upper and a lower support, a connection for a feed conduit for the feeding of a fluid sample into the spectrometer, a connection for a drain conduit for draining the fluid sample out of the spectrometer, an in particular cylindrically shaped sample tube arranged between the upper and the lower support for the acceptance of the fluid sample, whereby the one end of the sample tube communicates with the connector for the feed conduit and the other end with the connector for the drain conduit, as well as a radio frequency (RF) coil, surrounding the sample tube, for the production and/or detection of an RF-magnetic field perpendicular to the direction of the static magnetic field $B_0$ in a measurement volume within the sample tube.

An NMR spectrometer of this kind is, for example, known from DE-41 01 473 A1.

In NMR spectroscopic measurements of liquids it is usual to initially transfer the fluid to be investigated, which is normally stored and transported in a standard container, into a standardized glass tube which can be introduced into the probe head of an NMR spectrometer. In order to facilitate a quantitative comparison of the line intensity of different chemical components of the material being investigated, a reference fluid is often added to the material under investigation. In addition, for the purpose of stabilizing the homogeneous static magnetic field (or the measurement frequency) a deuterated fluid ("locking substance") is added, with the NMR signal of which, the magnetic field or the measurement frequency is stabilized ("locked"). The standardized NMR glass tube is subsequently introduced into an automatic sample changer from which it is introduced into the probe head at an appropriate time for taking of an NMR spectrum, usually with the suppression of the $H_2O$-line.

This method which, for example is known from the textbook "Practical NMR spectroscopy" from M. L. Martin et al., Heyden & Son Ltd., London 1980, in particular sides 365 ff, has the disadvantage that, in principle, a calibration fluid consisting of a reference fluid and/or a deuterated locking substance, must be added to the fluid material being investigated. This can be highly undesirable in particular for samples from the medical field (for example body fluids, cell- extracts and the like) or from food science chemistry (wine-extracts, milk, honey and the like). On the one hand the calibration fluids could undergo chemical reactions with the sample fluid and on the other hand, for example, the addition of a locking substance could change the pH-value of the fluid material under investigation and thereby lead to a changed NMR spectrum. The addition of $D_2O$ to $H_2O$ leads, furthermore, to a widening of the line due to the exchange between protons and deuterons. Thereby, in particular, the $H_2O$ signal is widened which renders a suppression of the usually undesired liquid sample water signal more difficult since signal suppression is easier the sharper the corresponding measured line.

Especially with medical samples, the addition of a standard liquid to the sample substance is likewise critical since the substantive content of the sample fluid can render the standardization more complex. This leads, on the other hand, to a change in the line width of the standard which renders a quantitative comparison of the line intensities more difficult.

A further disadvantage of the classical procedure is that the liquid sample, after the addition of the calibration fluid, can usually no longer be separated from the latter so that the sample substance is, possibly, unusable for further investigations and tests following the NMR measurement.

Finally, it is also been shown to be disadvantageous for the liquid sample be prepared prior to each NMR measurement through the addition of locking substances and/or standardized fluids, a process which usually must be carried out manually and, in addition to a substantial time loss, also encompasses certain risks such as, e.g., improper technical handling or shaking of the sample. In particular with the serial measurement of a plurality of similar fluid samples the above mentioned procedure is cumbersome and detrimental to an automatization of the measurement procedure.

Problems similar to those of the batch-procedure described above in NMR spectroscopic measurement of fluid samples result in the known flow-through method. A method and an apparatus for coupled fluid chromatography and NMR measurement, is, for example, disclosed in DE 41 04 075 C1, with which certain volumes of sample fluids are sectionwise introduced to the NMR probe head using the stop-flow technique. With the apparatus therein described it is, however, not possible to measure a mixture of fluid samples, rather the components of the fluid sample are chromatographically separated prior to the NMR spectroscopic measurement.

A continuous flow-through cell with which fluid mixtures can be subjected to an NMR measurement is, for example, known from U.S. Pat. No. 4,775,836 where a spherically shaped measurement cell, in the homogeneous center of an NMR spectrometer is described through which liquid sample substance is continuously fed under high pressure. An advantage of this configuration is that, through the spherical configuration of the measurement volume, artifacts due to inhomogeneities of the magnetic susceptibility in the measurement volume can be eliminated. Nevertheless, also in this case, the locking substance and/or standard liquid must be mixed with the sample fluid if a frequency stabilization, a field stabilization, or a quantitative comparison of the line intensities be required.

The same is true for the method known from DE 41 01 473 A1, and the accompanying NMR spectrometer likewise described in this publication, which exhibits all the categorizing features mentioned above.

Glass tubes which are insertable within another have been known for a long time in NMR spectroscopic applications with which one tube is filled with the sample fluid and the other with a calibrating fluid, the tubes then being introduced together into the probe head of the NMR spectrometer for measuring purposes (see for example catalog 5/92-7 of Wilmad Glass Company, Buena, N.J. 08310 USA, pages 28 and 29). In this manner, although a mixing of the material being investigated with other materials from the calibration liquid is prevented, the required manual filling procedure of both fluids, the putting together of the tubes, and the introduction into the spectrometer continue, however, to be very time consuming and still bear the risks of a shaking or an unintentional mixture of the fluids involved. The time delay thereby produced between the extraction of a medical sample fluid and the NMR measurement can be very disadvantageous for the investigation of sensitive and easily disrupted body fluids. Furthermore, there is increased danger during the filling-in and filling-up procedure of inducing a contamination of the liquid sample with bacteria, air, dirt etc. Through a differing individual treatment of the manually prepared sample fluids, measurement errors in serial measurements cannot be ruled out with sufficient certainty. In addition, with the utilization of the known double tube, the application of a flow-through probe head is ruled out, e.g., with an apparatus with which such double tubes are utilized, it is only possible to carry out fluid measurements in a sectionwise fashion.

It is therefore the underlying purpose of the invention to introduce an NMR spectrometer of the above mentioned kind for measurements of fluid samples with which the sample fluids can be measured without additives and, after the measurement, be recaptured in their original state with which a special prehandling of the sample is unnecessary. Accordingly the inventive spectrometer can be utilized for flow-through measurements as well as in sectionwise operation (stop-flow) without substantial reconfiguration and is suitable, in particular, for automatic serial measurements of a plurality of similar fluid samples, whereby, on the one hand, little or no manual preparation of the sample should be necessary, and on the other hand a field stabilization and/or a quantitative comparison of the line intensities on the basis of a reference substance can be accommodated.

SUMMARY OF THE INVENTION

This purpose is achieved in accordance with the present invention in a surprisingly simple and effective manner in that, coaxial to the sample tube, an additional, in particular a likewise cylindrical tube, is provided for the acceptance of a calibration fluid which is connected on its one end to an additional connector for a feed conduit for feeding the calibration fluid into the spectrometer and on its other end to an additional drain conduit connector for draining the calibration fluid out of the spectrometer.

Due to the built-in coaxial additional calibration fluid sample tube, it is easily possible to simultaneously record NMR signals from the fluid sample substance, from the locking substance and/or from a reference fluid without having the components of the calibration fluid come in physical contact with the sample fluid. Thereby, in particular, on-line serial measurements which can to a large extent be automatized are possible with standard laboratory containers, something which is impossible with the utilization of the classical double tube. After finishing a measurement it is no longer necessary to carry out the difficult cleaning procedure required with the known double tubes and both the, generally, very expensive calibration fluid as well as the sample substance, which quite possibly was obtained under difficult circumstances (in particular with medical applications) can be nearly completely recovered in their original state.

In a preferred embodiment of the NMR spectrometer in accordance with the invention the sample tube and the additional tube are nested within each other in the manner of a double tube. In principal, other relative spatial configurations of the tubes are conceivable, however, the nested configuration guarantees the largest possible symmetry of the measurement configuration and an optimal utilization of the region of largest magnetic field homogeneity in the spectrometer.

In a further preferred embodiment, the RF-coil directly surrounds the outside of both tubes. This contributes to a substantial improvement in the signal to noise ratio of the NMR measurement.

An embodiment is particularly preferred in which the additional tube is arranged within the sample tube. In this fashion, on the one hand, the fill-factor of the measurement configuration is optimized, and on the other hand the shimming capability using a locking substance is improved because the shimming volume is reduced, closer to the axis, and thereby better defined. In addition the signal to noise ratio for the locking procedure is increased since the frequency standard is arranged in the most homogeneous region of the static $B_0$-field.

A further embodiment is advantageous with which the connection of the connectors to the feed and drain conduits is arranged in a detachable fashion. In this manner it is simpler for probe heads to be exchanged.

Normally the RF-coil is configured for the measurement of protons or fluorine nuclei. In preferred embodiments of the invention additional RF-coils are provided for. Thereby an additional RF-coil is configured for separate measurement of NMR signals from the calibration liquid, in particular from the deuterium nuclei contained therein. In another embodiment, or optionally in addition thereto, a further RF-coil can be configured for the individual excitation of hetero-nuclei. The expression hetero- nuclei refers in general to all nuclei other than protons and fluorine, for example $^{13}$C-nuclei. In the first case the additional RF-coil facilitates a separate frequency or field lock onto the deuterium signal, in the second case an indirect heteronuclear observation.

In one embodiment of the invention the sample tube is directed with its axis parallel to the direction of the homogeneous static magnetic field $B_0$ and the RF-coils are configured as saddle coils. Another possibility is that the sample tube is directed with its axis perpendicular to the direction to the homogeneous static magnetic field, whereby solenoid-coils can then also be utilized as RF-coils.

Preferentially, at least two different and, possibly, a plurality of probe heads with compatible connectors are provided for in the inventive NMR spectrometer so that the probe heads can easily be exchanged with another and connected to the feed and drain conduits.

An improvement of this embodiment is particularly advantageous with which the diameter of the sample tube as well as the diameter of the additional tube differs for differing probe heads. The differing dimensioning of the tube geometry and the corresponding RF-coil facilitates the preparation of probe heads for differing applications. Thereby, starting with the normal sample sizes for medical applications, stepped sizes down to probe heads for the measurement of micro probes with minimum liquid volume can be produced.

An embodiment of the inventive NMR spectrometer which is particularly well suited for serial measurements or routine measurements of a large number of standardized samples is one in which a device is provided for the automatic removal of sample fluid from a standard sample receptacle and the introduction and injection of the removed sample fluid into the sample tube.

In a further embodiment a, for example, optical or electrical sensor is provided for in the probe head for the recognition of the arrival of the sample fluid in the probe head. The sensor, which for example can measure the fluorescence or the conductivity of its environment can, through an appropriate change of the measurement value, indicate the arrival of the sample by means of an electrical signal fed to a detector with an appropriate signal processing device, which for its part transfers the information to a larger control unit so that to a largely automated filling and measurement procedure is realized. In order to allow for differing disposal of the measured liquid samples, in a further embodiment, one or more multiple-way valves are provided for in the drain conduit.

An improvement of this embodiment is particularly advantageous with which a fraction collector and at least one waste container are provided for which are fed, alternatively, by drain conduits coming from a multiple-way valve. A possibly valuable or important liquid sample can largely be regained in the fraction collector while components of lesser or no importance, for example the below mentioned transport fluid for the transport of the sample, can be introduced into a waste container for subsequent disposal.

An embodiment is particularly preferred in which a transport fluid which is particularly well-matched to the properties of the sample fluid, for example water, isotonic solution etc. is provided for the transport of the sample fluid into the inlet and drain conduits.

An embodiment is particularly advantageous with which a device for the feeding of inert gas into the feed and/or drain conduits is provided for. The inert gas can, for example, be utilized to dry the measurement system after a measurement run or following a rinsing of the system.

An improvement is particularly advantageous with which the device for the feeding of inert gas is so configured that a gas bubble can be produced between the sample fluid and the transport fluid. In this fashion the two fluids can be spatially separated so that a possibly disruptive mixing is eliminated.

In an embodiment, a device for introducing washing liquid into the inlet and drain conduits can be provided for in order to clean the transport system and the sample tube.

The advantageous properties of the NMR spectrometer in accordance with the invention are particularly effective when a processor, preferentially a personal computer, is provided for the control of the automatic or semi-automatic liquid transport process. Clearly a manual introduction of the liquids is also possible, however, the serial measurements facilitated by the inventive system could thereby be rendered more difficult or slowed down.

A method for the operation of a NMR spectrometer of the kind described in detail above is also within the framework of the present invention with which, initially, the calibration fluid is injected into the additional tube and, subsequently, preferentially automatically in a computer controlled fashion, the following steps are carried out:
 (a) Removal of a sample fluid from a sample supplier;
 (b) transport of the fluid to the probe head;
 (c) injection of the sample fluid into the sample tube;
 (d) measuring of NMR signals from the sample fluid;
 (e) if appropriate, rinsing of at least a part of the inlet and drain conduit with a washing fluid simultaneous with step (d);
 (f) draining of the sample fluid out of the probe head;
 (g) if appropriate, rinsing that portion not rinsed in step (e) of the feed and drain conduits as well as the sample tube with the washing fluid;
 (h) if appropriate, drying the conduit with inert gas;
 (i) repetition of the steps (a) through (h) with an additional sample fluid.

The invention is described and explained in greater detail below using the embodiments represented in the drawing. The features which can be extracted from the description and from the drawing can be applied in other embodiments of the invention individually or collectively in arbitrary combination.

DESCRIPTION OF THE PREFERRED EMBODIMENT

Figure 1:
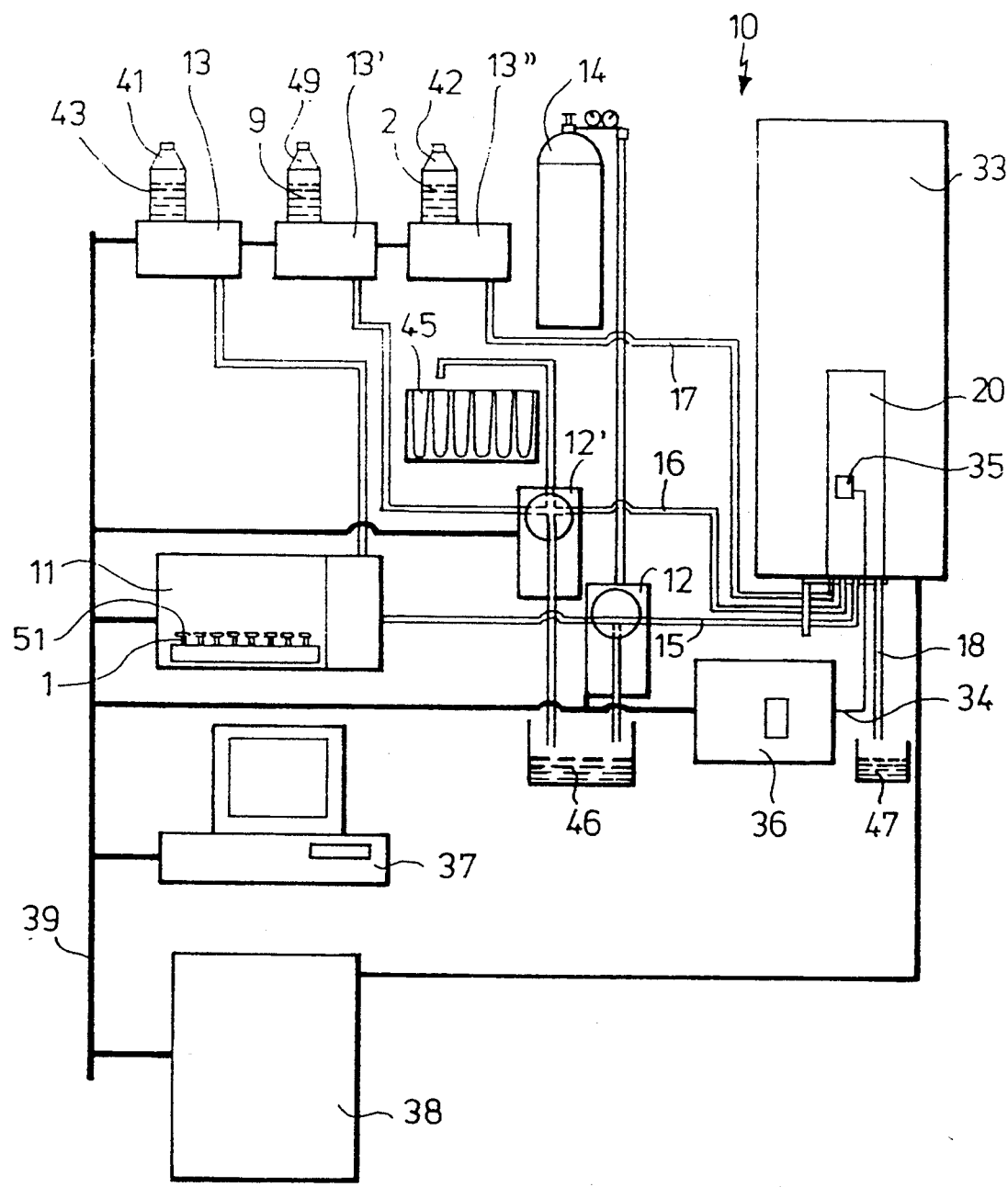
FIG. 1 shows a schematic representation of an NMR spectrometer in accordance with the invention with computer control for the automatization of serial investigations of liquid samples.

The nuclear magnetic-resonance (NMR) spectrometer 10 schematically represented in FIG. 1 for the measurement of fluid, in particular biological samples, exhibits a magnet system 33 with which, within a measurement volume, a homogeneous static magnetic field $B_o$ is produced. A sample fluid 1 is introduced, with the assistance of a pump 13 and a transport fluid 43, from a storage container 51 via a feed conduit 15 into an NMR probe head 20 located in the homogeneous region of the magnetic field $B_0$ and, subsequent to the NMR measurement, is removed via a drain conduit 16. With serial measurements of a plurality of similar fluid samples, the removal of the corresponding measurement samples transpires in the storage container 51 via a device 11 (autosampler) for the automatic removal of liquid samples 1. Via a multiple way valve 12' (here, in particular, a four-way valve) it is possible to drain the sample fluid 1 subsequent to the NMR measurement either into a fraction collector 45 or into a waste container 46.

For the purposes of magnetic field stabilization ("field lock") or frequency stabilization of the NMR-measurement frequency ("frequency lock") a calibration fluid 2, which usually contains a deuterated locking substance, is introduced to the probe head 20 of the spectrometer 10 simultaneously with the introduction of the sample fluid 1. In addition, a reference fluid for the quantitative comparison of the measured NMR line intensities can also be located in the calibration fluid 2. The calibration fluid 2 is transported out of a storage container 42 via a pump 13" by way of a feed conduit 17 into the probe head 20 and, after one or more NMR measurements, is drained via a drain conduit 18 into a collecting container 47.

The calibration fluid 2 can clearly also be introduced in a manual fashion to the probe head 20 since it usually remains in the measurement system for a large number of measurements of differing fluid samples. In order to achieve a better averaging over inhomogeneities of the calibration fluid, it is, however, also possible to connect the collecting container 47 to the storage container 42 and to pump the calibration fluid in a closed circulation loop with the assistance of the pump 13".

Furthermore, in the system represented in FIG. 1, a washing liquid 9 is provided for in a storage container 49 which, with the assistance of a pump 13', is transportable via the three-way valve 12' into the drain conduit 16 through the sample path in the probe head 20 into the feed conduit 15 in order, after completion of the measurement of a fluid sample, to clean the system from sample remnants. Finally, an inert gas, from an inert gas feed 14, can be introduced into the conduit system via the multiple-way valve 12 in order to dry this system in preparation for the subsequent measurement of a fluid sample.

The control of the above mentioned method transpires in a computer controlled fashion, in the example shown, via a personal computer (PC) 37 which is connected via system network cable 39 on the one hand to an NMR console 38 and on the other hand to the autosampler 11, the pumps 13, 13', 13", the multiple way valves 12, 12' as well as to a detector 36 which, via a sensor cable 34, receives a signal from a sensor 35 positioned on or in the probe head 20, the signal indicating the arrival of sample fluid 1 in the measuring head 20. With the assistance of the computer 37 it is possible, for example in the manner described more closely below, to carry out entire measurement series of fluid samples with intermediately activated cleaning steps in a fully automatic fashion.

Figure 2A:
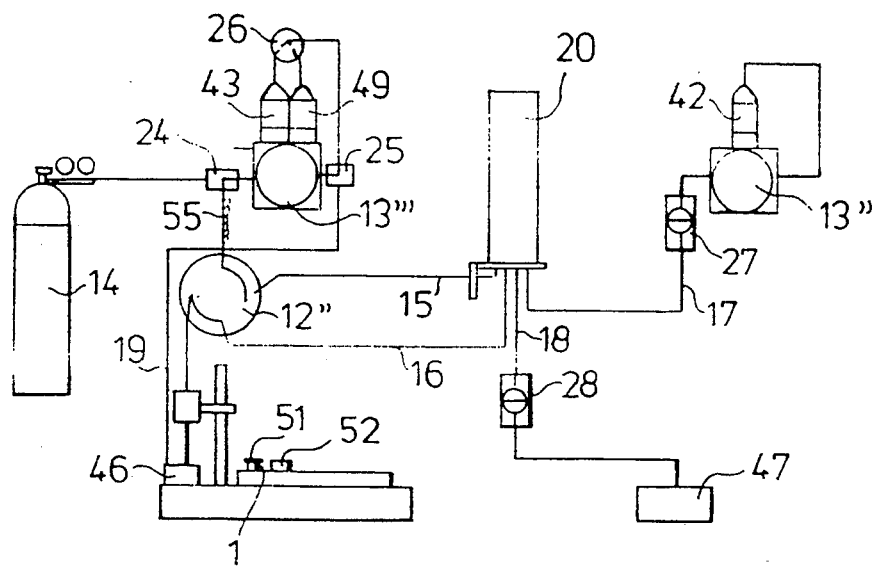
FIG. 2a shows schematic representations of a step of a possible method to be carried out on the inventive NMR spectrometer.
Figure 2B:
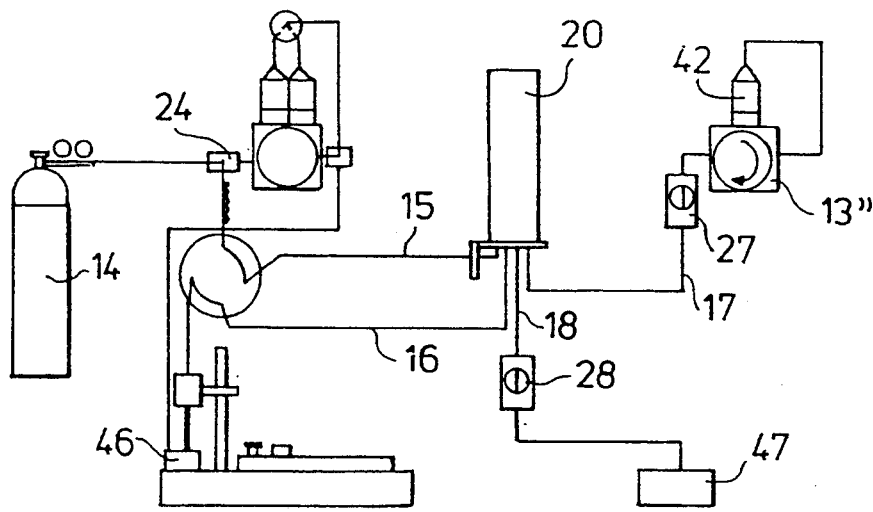
FIG. 2b shows schematic representations of a step of a possible method to be carried out on the inventive NMR spectrometer.
Figure 2C:
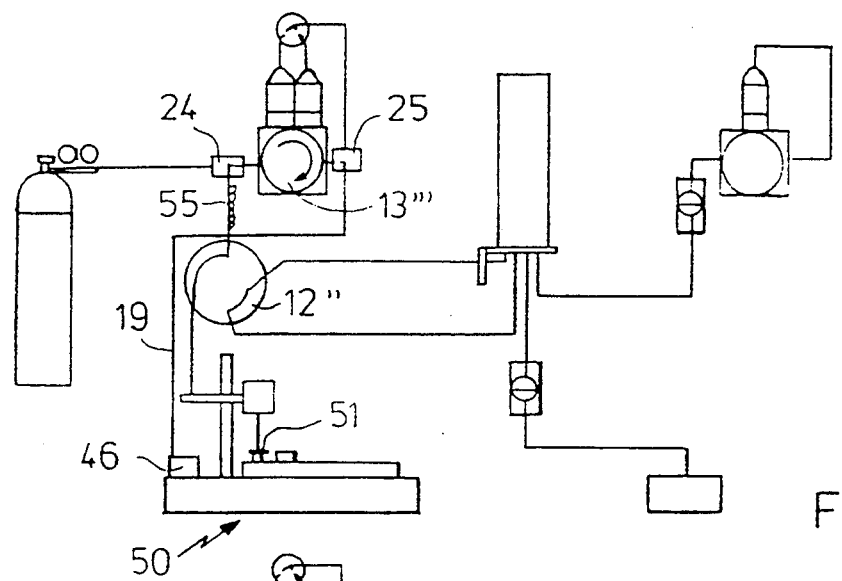
FIG. 2c shows schematic representations of a step of a possible method to be carried out on the inventive NMR spectrometer.
Figure 2D:
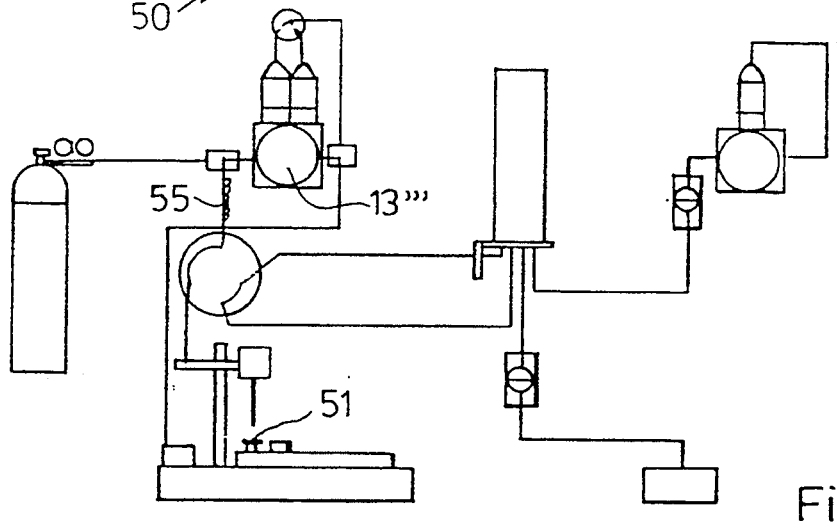
FIG. 2d shows schematic representations of a step of a possible method to be carried out on the inventive NMR spectrometer.
Figure 2E:
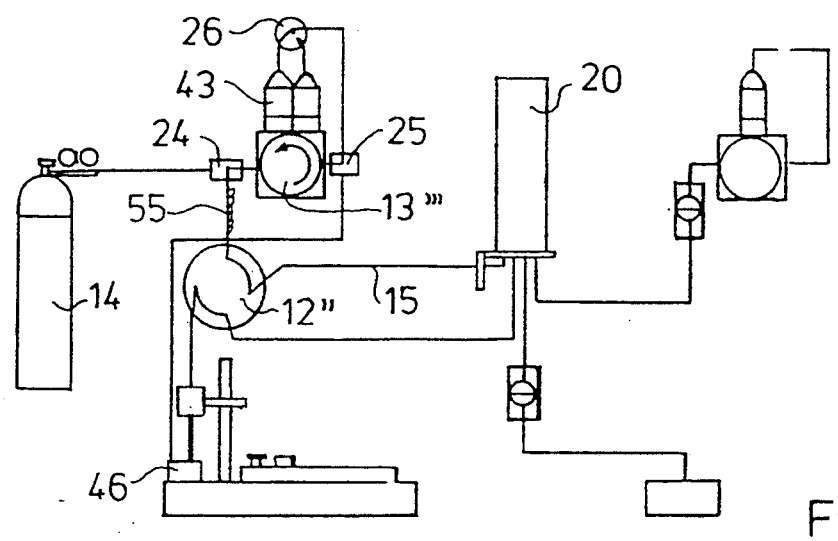
FIG. 2e shows schematic representations of a step of a possible method to be carried out on the inventive NMR spectrometer.
Figure 2:
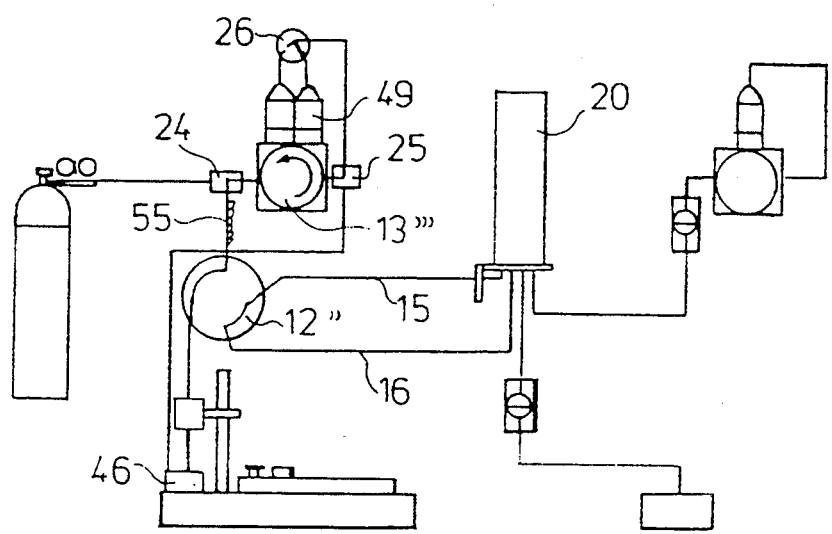
FIG. 2f shows schematic representations of a step of a possible method to be carried out on the inventive NMR spectrometer.
FIG. 2g shows schematic representations of a step of a possible method to be carried out on the inventive NMR spectrometer.
FIG. 2h shows schematic representations of a step of a possible method to be carried out on the inventive NMR spectrometer.

The FIGS. 2 a through h show, in detail, a possible sequence of the procedural steps whereby in FIG. 2a, for reasons of clarity, all the components contributing to the differing procedural steps are represented with reference symbols.

In a first step (FIG. 2b) dried gas is introduced, via the inert gas feed 14 and a valve 24, through the feed conduit 15, the sample path in probe head 20, and the drain conduit 16 into the waste container 46. In this fashion the conduit system is dried for the sample fluid 1 and prepared for the subsequent measurement. Simultaneously in this first step, fresh calibration fluid 2 is transported out of the storage container 42 with the assistance of pump 13" via a shut-off valve 27 and the feed conduit 17 into the probe head 20, while, via the drain conduit 18 and an open valve 28, used calibration liquid 2 located in the probe head 20 is introduced to the collecting container 47. Subsequently, the valves 27 and 28 are closed and, according to need, which under certain circumstances only follows a large number of NMR fluid sample measurements are again opened in order to introduce fresh calibration fluid 2 into the probe head 20.

FIG. 2c shows, in a second step, the charging of sample fluid 1 from a standardized sample holder 51 in a combined device 50 which among other things includes an autosampler and a fraction collector. Thereby sample fluid 1 is transported out of the sample holder 51 into a sample loop 55 by means of the pump 13''' via the multiple way valve 12" the arrival of the sample fluid 1 in the sample loop 55 being capable of signalization, with the assistance of a sensor which is not represented in greater detail and of a corresponding detector, to a control unit which is also not represented in FIG. 2. Simultaneously the valves 24 and 25 are open so that, via pump 13''', it is possible to force residual fluids, which possibly remain in the conduit section 19, into the waste container 46 until sample liquid 1 arrives in the sample loop 55.

As soon as the sample fluid 1 has arrived in the sample loop 55, the pump 13''' is stopped and the connection of the conduit system to the sample holder 51 is broken off (FIG. 2d).

In the next step (FIG. 2e) the pump 13''' rotates in the opposite direction, whereby the sample fluid located in the sample loop 55, with the assistance of a transport fluid taken from the storage container 43, the transport fluid gaining access to the sample loop 55 via the valves 26, 25 and 24, is transported through the feed conduit 15 into the probe head 20. By switching of the valve 24 between the steps represented in FIG. 2d and FIG. 2e it would also be possible to introduce an inert gas bubble from the inert gas feed 14 between the sample fluid 1 and the transport fluid 43 in the conduit system to act as a buffer.

In the method step indicated in FIG. 2f the feed conduit 15 and the drain conduit 16 for the sample fluid 1, which at this time is located in probe head 20, can be short-circuited through an appropriate positioning of the multiple-way valve 12'; in this state the NMR measurement of the fluid sample is carried out. Simultaneously, washing fluid is suctioned in through the valve 26 out of the storage container 49 via the valve 25 by means of the pump 13''' and forced through the valve 24 and the sample loop 55 into the waste container 46 so that the sample loop 55 region is cleaned of residual sample fluids 1 as well as of the transport fluid.

Figure 2G:
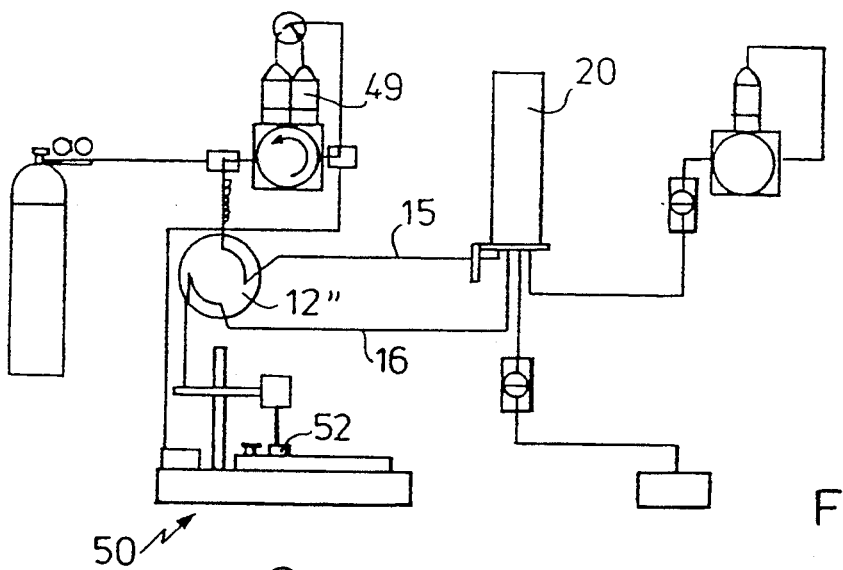

In the step represented in FIG. 2g the washing fluid is transferred out of the storage container 49, through an appropriate positioning of the multiple-way valve 12", into the feed conduit 15 to the probe head 20 after the NMR measurement of the sample has been completed. Simultaneously the sample fluid 1 is directed out of the probe head 20 through the drain conduit 16 and the multiple-way valve 12' into a fraction container 52 which is located in the combined device 50 with integrated autosampler and fraction collector. In order to minimize the diluted phase which normally exists at the end of the measured sample fluid 1, it is possible to introduce, from the beginning and from the end, approximately 10% of the sample fraction to the waste container 46. In this fashion although only approximately 80% of the sample fluid 1 can be recycled. This can, however, be done in the original concentration. This intermediate step is not necessary when, by means of a gas bubble from the inert gas feed 14, the sample fluid 1 is spatially separated from the transport fluid. In this case the complete sample fluid 1 can be recycled into the fraction container 52.

Figure 2H:
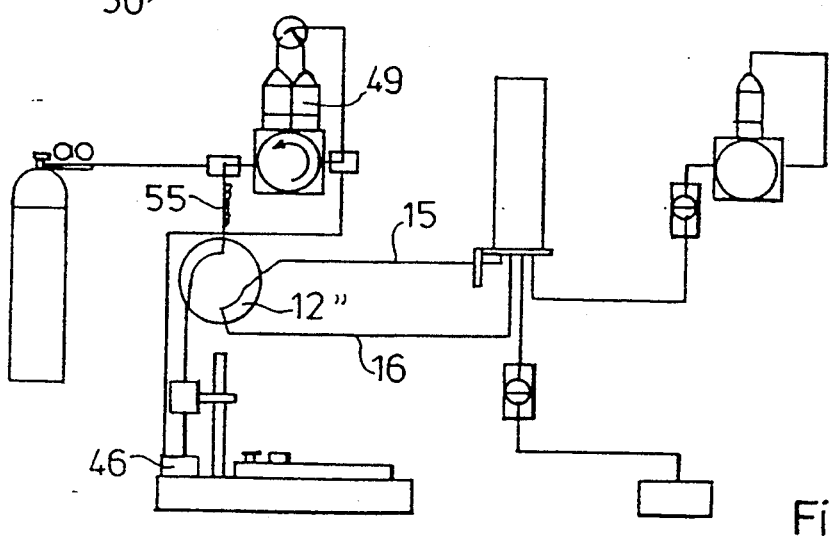

In the cleaning step represented in FIG. 2h, washing fluid is finally pumped out of the storage container 49 via the sample loop 55 into the waste container 46, while the feed conduit 15 and the drain conduit 16 are short-circuited by means of the multiple-way valve 12'. Since washing fluid is still located in the feed conduit 15 from the previous step (FIG. 2g), by means of a subsequent blowing through of the system with inert gas (see FIG. 2b), the feed conduit 15, the sample path in the measuring head 20 and the drain conduit 16 are cleaned with washing fluid before the conduit system is dried by the subsequently flowing inert gas.

Figure 3:
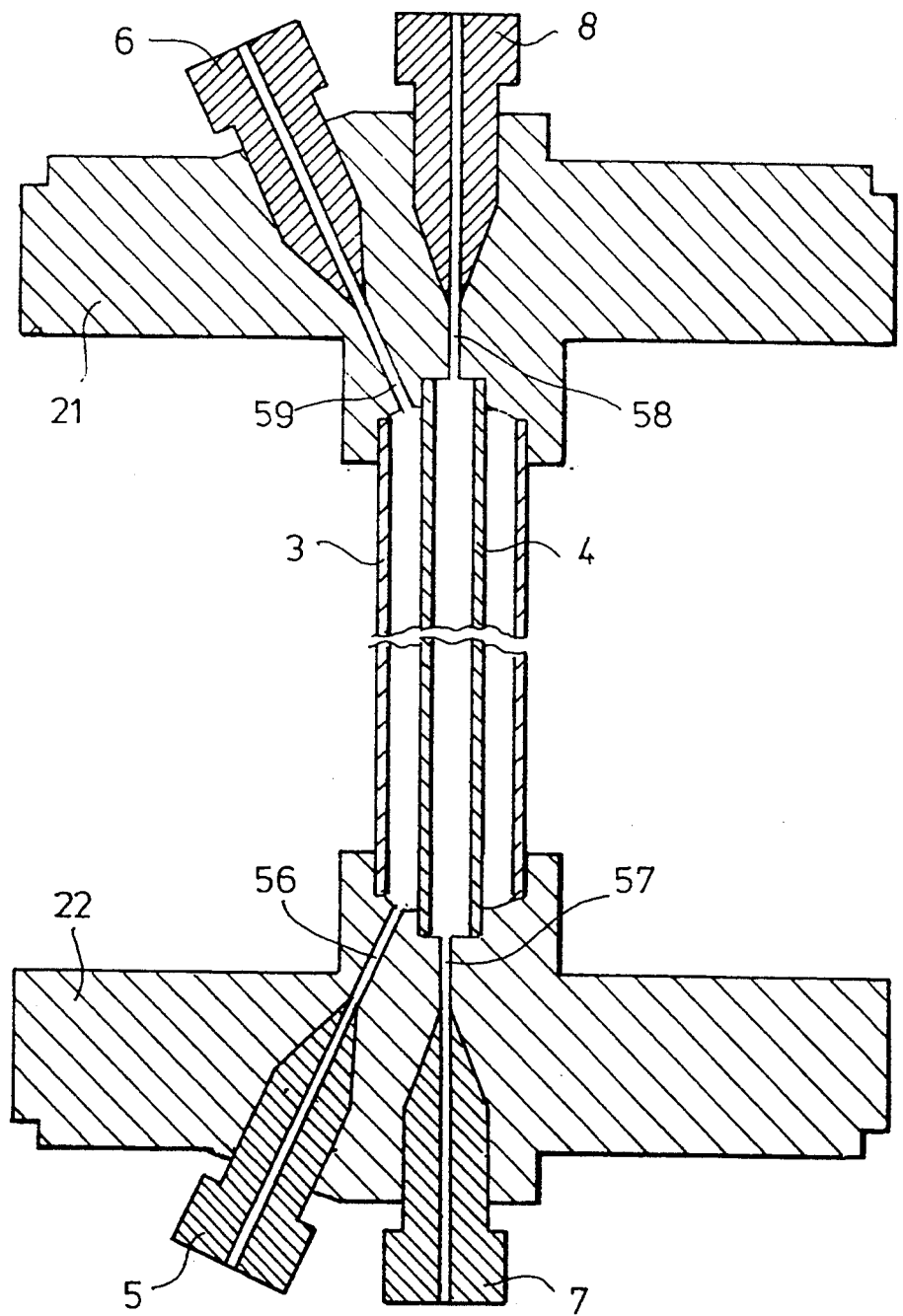
FIG. 3 shows a lengthwise cut through the important portions of flow-through probe head in accordance with the invention with separate feed of calibration and sample fluids.

FIG. 3 shows details of the construction of the probe head in accordance with the invention. The measurement cell consists of two parallel-running centered glass tubes which are inserted within each other, whereby the sample tube 3 surrounds the additional tube 4. The glass tubes are mechanically supported from an upper support 21 and a lower support 22. A connector 5 for the introduction of sample fluid 1 into the sample tube 3 is provided for in the lower support 22 (for example screwed or inserted in), the connector 5 feeding on one end into an injection channel 56, provided in the lower support 22, by means of which sample fluid 1 can be injected into the sample tube 3. Via a drain channel 59 in the upper support 21 as well as the connector 6, the sample fluid 1 can again leave the sample tube 3. In a similar fashion, a connector 7 for the feed, an injection channel 57 in the lower support 22, a drain channel 58 in the upper support 21 as well as a connector 8 for the drainage are provided for the feed and drain of calibration fluid 2 to and from the additional tube 4. The free ends of the connectors 5 to 8 can be connected to the corresponding feed and drain conduits 15 through 18 in a disconnectable fashion.

Although, for NMR measurements, it has been shown to be normally useful for the inner additional tube 4 to be utilized for the calibration fluid, in special applications the outer tube 3 can be filled with calibration fluid 2, while the inner additional tube 4 can be filled with sample fluid 1. An improved fill-factor for the NMR measurement of the sample fluid 1 is however in any event achieved if the sample fluid is arranged in the outer tube and the calibration fluid 2, containing a locking substance and/or a standard fluid, in the inner tube.

For normal probe volumes it is possible to choose the dimensions of the tubes in such a fashion that the sample tube 3 exhibits an outer diameter of 8 mm and an inner diameter of 7 mm, while the additional tube 4 has an outer diameter of 1.7 mm and an inner diameter of 1.3 mm. In certain applications however micro-samples with extremely small volumes are utilized for which the tubes can be dimensioned smaller. In these cases the outer diameter of the outer tube 3 can be chosen to be 4 mm and its inner diameter 3.2 mm. It is however advantageous if the dimensioning of the inner tube 4 is maintained at the values of inner diameter 1.3 mm and outer diameter 1.7 mm.

In order to reconfigure an NMR spectrometer in a simple fashion for various applications it is possible to provide for a plurality of different probe heads having, with regard to the conduits 15 through 18, compatible connectors 5 through 8 but with different diameters for tubes 3 and 4. In any event the assembly shown in FIG. 3 is suitable for the application of serial NMR measurements of a plurality of liquid samples.

Figure 4:
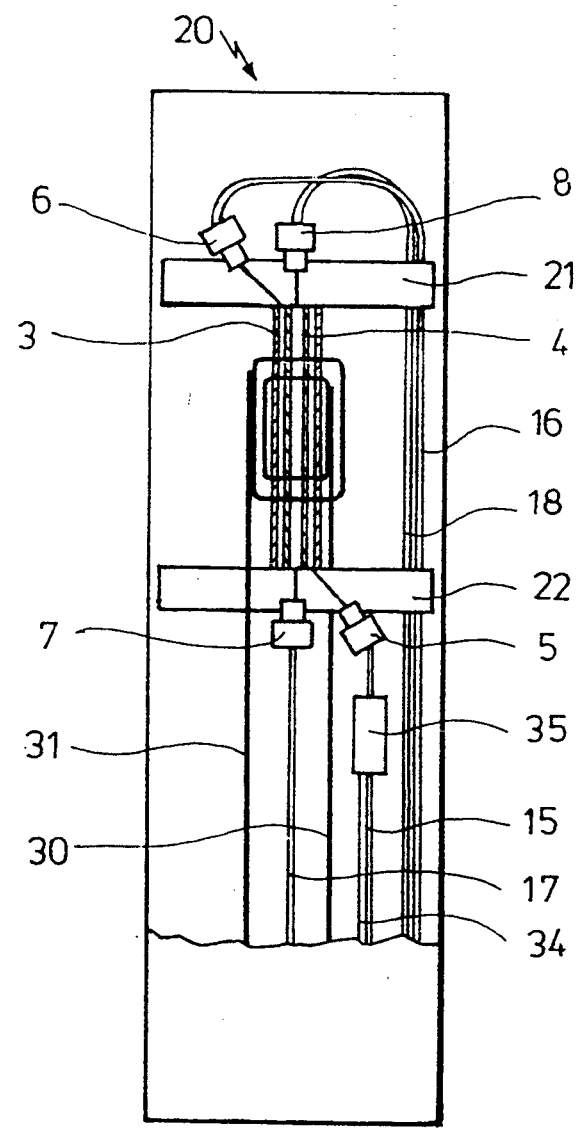
FIG. 4 shows a schematic side view of the flow-through probe head in accordance with the invention with corresponding feed and drain conduits and RF-coils.

Finally FIG. 4 shows, in a schematic side view, the upper part of the inventive probe head 20 with the feed and the drain conduits 15 to 18 for the sample fluid 1 or the calibration fluid 2 as well as the connectors 5 through 8 situated in the holders 21 and 22. A sensor 35 is shown in the feed conduit 15 shortly before its connection to the connector 5. It is thereby, via a sensor cable 34, possible to transmit a signal, upon arrival of the sample fluid 1 in the probe head 20, to the computer 37, which is schematically represented in FIG. 1, in order to automatically start the taking of a spectrum.

FIG. 4 further shows a possible configuration for the radio frequency (RF)-coil 30 necessary for NMR measurements, the coil 30 preferentially being arranged in close proximity to the outer portions of both tubes 3, 4 to facilitate an optimal signal to noise ratio. Normally an RF-coil 30 is configured for the measurement of protons or fluorine nuclei.

In addition a further RF-coil 31 is represented which can be configured for separate measurements of NMR signals from the calibration liquid 2, in particular of the deuterium nuclei contained therein, for purposes of a magnetic field or frequency stabilization. The additional RF-coil 31 can, however, also be provided for the purposes of separate measurements of NMR signals from hetero-nuclei (all nuclei except for protons and fluorine; e.g. $^{13}C$).

In the embodiment shown in FIG. 4 the RF-coils 30, 31 are configured as saddle coils and the sample tube 3 is directed with its axis parallel to the direction of the homogeneous static magnetic field $B_0$. In other embodiments the sample tube 3 can also be configured perpendicular to the direction of the magnetic field and the RF-coils 30, 31 can be configured to be solenoid coils.

It is particular advantageous to utilize the above described NMR-spectrometer in accordance with the invention for serial investigations of a large number of similar liquid samples, in particular for on-line-measurements from laboratory standard containers, whereby the cleaning of the conduit system following every measurement process is relatively simple or can be automated. Applications of the device in accordance with the invention are quality control in industry, rapid diagnoses of illness based on body liquids for clinical applications and routine measurements of large sample numbers in industry and universities.

We claim:

1. A nuclear magnetic resonance (NMR) spectrometer for the measurement of fluid samples, comprising a magnetic system for the production of a homogeneous static magnetic field $B_0$, a probe head exhibiting an upper and a lower support, a feed conduit connector communicating with a feed conduit for the introduction, of the fluid sample into the spectrometer, a drain conduit connector communicating with a drain conduit to drain the fluid sample out of the spectrometer, a sample tube arranged between the upper and the lower supports for the acceptance of the fluid sample, the sample tube having a first end communicating with the feed conduit connector and a second end communicating with the drain conduit connector, and a radio frequency (RF)-coil surrounding the sample tube for at least one of a production and a detection of an RF-magnetic field directed, in a measurement volume within the sample tube, perpendicular to the direction of the static magnetic field $B_o$, further comprising an additional tube, coaxial to the sample tube, adapted to accept a calibration fluid, the additional tube having a first end communicating with an additional feed conduit connector for an introduction of a calibration liquid into the spectrometer and a second end communicating with an additional drain conduit connector to drain the calibration fluid out of the spectrometer.

2. The NMR spectrometer of claim 1, wherein the sample tube and the additional tube nest within one another to form a double tube.

3. The NMR spectrometer of claim 2, wherein the RF-coil surrounds, in close proximity, an outer portion of the double tube.

4. The NMR spectrometer of claim 2, wherein the additional tube comprises the inner tube.

5. The NMR spectrometer of claim 1, wherein the connectors comprise disconnectors adapted to easily disconnect from the respective conduits.

6. The NMR spectrometer of claim 1, wherein the RF-coil comprises at least on of a proton excitation RF coil and a fluorine nuclei excitation RF coil.

7. The NMR spectrometer of claim 1, further comprising an additional RF-coil.

8. The NMR spectrometer of claim 7, wherein the additional RF coil comprises a calibration fluid measurement coil for measuring NMR signals from the calibration fluid.

9. The NMR spectrometer of claim 7, wherein the additional RF-coil comprises a hetero-nuclei excitation coil.

10. The NMR spectrometer of claim 1, wherein the sample tube has an axis parallel to the direction of the homogeneous static magnetic field $B_0$ and the RF-coil comprises a saddle coil.

11. The NMR spectrometer of claim 1, wherein the sample tube has an axis perpendicular to the direction of the homogeneous static magnetic field $B_0$ and the RF coil comprises a solenoid coil.

12. The NMR spectrometer of claim 1, further comprising an additional probe head, wherein both probe heads comprise connectors communicating with the conduits.

13. The NMR spectrometer of claim 12, wherein the sample tube and the additional tube have diameters which differ with differing probe heads.

14. The NMR spectrometer of claim 1, further comprising means adapted to automatically remove sample fluid from a standard sample bottle and introduce the removed sample fluid into the sample tube.

15. The NMR spectrometer of claim 1, wherein the probe head comprises a sensor means adapted to recognize the arrival of the sample fluid in the probe head.

16. The NMR spectrometer of claim 1, further comprising a multiple-way valve communicating with the drain conduit.

17. The NMR spectrometer of claim 16, further comprising a fraction collector, a waste container, and a plurality of drain conduits, and wherein the multiple-way valve communicates with the drain conduits and with the fraction collector and waste container to alternately feed the fraction collector and the waste container in dependence on the multiple-way valve.

18. The NMR spectrometer of claim 1, further comprising a transport fluid communicating with the feed and drain conduits, the transport fluid being adapted to transport the sample fluid through the feed and drain conduits.

19. The NMR spectrometer of claim 1, further comprising an inert gas device communicating with at least one of the feed conduit and the drain conduit for introducing inert gas into at least one of the feed and the drain conduit.

20. The NMR spectrometer of claim 19, further comprising a transport fluid for transporting the sample fluid through the feed conduit and the drain conduit, and wherein the inert gas device produces a gas bubble between the sample fluid and the transport fluid.

21. The NMR spectrometer of claim 1, further comprising a washing device means communicating with the feed and drain conduits which introduces a washing fluid into the feed and the drain conduit.

22. The NMR spectrometer of claim 1, further comprising a computer communicating with the feed and drain conduits and adapted to control a semi-automatic fluid transport procedure.

23. A method for the operation of an NMR spectrometer of the kind having a probe head comprising a sample tube communicating with a feed and a drain conduit and an additional tube communicating with an additional feed and additional drain conduit, the method comprising injecting a calibration fluid into the additional tube and subsequently further comprising the steps of:
(a) extracting a sample fluid from a sample supplier;
(b) transporting the sample fluid to the probe head;
(c) injecting the sample fluid into the sample tube;
(d) measuring NMR signals from the sample fluid;
(e) rinsing at least a portion of the feed conduit and the drain conduit with a washing fluid simultaneous with step (d);
(f) draining the sample fluid out of the probe head;
(g) rinsing portions of the feed conduit, the drain conduit, and the sample tube with the washing fluid which were not rinsed in step (e);
(h) drying the conduits with inert gas;
(i) repeating the steps (a) through (h) with a different sample fluid.

* * * * *